United States Patent
Wang

(10) Patent No.: US 9,377,899 B2
(45) Date of Patent: Jun. 28, 2016

(54) OPTICAL SENSING TYPE BUILT IN TOUCH CONTROL SCREEN PANEL AND A DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Xiao Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 32 days.

(21) Appl. No.: 14/348,316

(22) PCT Filed: Nov. 18, 2013

(86) PCT No.: PCT/CN2013/087323
§ 371 (c)(1),
(2) Date: Mar. 28, 2014

(87) PCT Pub. No.: WO2014/183402
PCT Pub. Date: Nov. 20, 2014

(65) Prior Publication Data
US 2015/0029157 A1    Jan. 29, 2015

(30) Foreign Application Priority Data

May 17, 2013    (CN) .......................... 2013 1 0183624

(51) Int. Cl.
*G06F 3/042*    (2006.01)
*G06F 3/041*    (2006.01)
(Continued)

(52) U.S. Cl.
CPC ............ *G06F 3/042* (2013.01); *G06F 3/03547* (2013.01); *G06F 3/0412* (2013.01); *H03K 17/9629* (2013.01); *H03K 17/9631* (2013.01); *H03K 2217/96015* (2013.01)

(58) Field of Classification Search
CPC ................................................... G06F 3/0421

USPC .......................................................... 345/175
See application file for complete search history.

(56) References Cited

U.S. PATENT DOCUMENTS

2007/0290971 A1    12/2007    Shih et al.
2009/0027350 A1*   1/2009    Lee ...................... G06F 3/0412
                                                                345/173

(Continued)

FOREIGN PATENT DOCUMENTS

| CN | 102937852 A | 2/2013 |
| CN | 103019476 A | 4/2013 |
| CU | 103294283 A | 9/2013 |

OTHER PUBLICATIONS

International Search Report mailed Feb. 20, 2014; PCT/CN2013/087323.

(Continued)

*Primary Examiner* — Long D Pham
(74) *Attorney, Agent, or Firm* — Ladas & Parry LLP

(57) ABSTRACT

An optical sensing type built in touch control screen panel and a display device are provided. The optical sensing type built in touch control screen panel includes an array substrate having a plurality of pixel units arranged in a matrix. The array substrate has touch control scanning lines between adjacent rows of the pixel units. The array substrate has touch control reading lines between adjacent columns of the pixel units. The array substrate has a photosensitive transistor and a touch control switch unit in a region defined by the touch control scanning lines and the touch control reading lines; the photosensitive transistor has a drain connected with the touch control switch unit, the touch control switch unit is connected with the touch control scanning line and the touch control reading line, respectively, so as to control ON/OFF between the drain of the photosensitive transistor and the touch control reading line.

20 Claims, 6 Drawing Sheets

(51) Int. Cl.
*G06F 3/0354* (2013.01)
*H03K 17/96* (2006.01)

(56) References Cited

U.S. PATENT DOCUMENTS

| | | | |
|---|---|---|---|
| 2011/0069020 A1* | 3/2011 | Kim et al. | 345/173 |
| 2011/0310036 A1* | 12/2011 | Juan et al. | 345/173 |
| 2012/0139876 A1 | 6/2012 | Jeon et al. | |
| 2012/0162126 A1* | 6/2012 | Yuan et al. | 345/174 |
| 2013/0050148 A1* | 2/2013 | Jeon et al. | 345/175 |
| 2013/0063398 A1* | 3/2013 | Ko et al. | 345/175 |
| 2013/0069914 A1 | 3/2013 | Chang et al. | |
| 2014/0111473 A1 | 4/2014 | Yang et al. | |

OTHER PUBLICATIONS

First Chinese Office Action Appln. No. 201310183624.7; Dated Jul. 3, 2015.

International Preliminary Report on Patentability issued Nov. 17, 2015; PCT/CN2013/087323.

Second Chinese Office Action dated Dec. 23, 2015; Appln. No. 201310183624.7.

\* cited by examiner

OPTICAL SENSING TYPE BUILT IN TOUCH CONTROL SCREEN PANEL AND A DISPLAY DEVICE

TECHNICAL FIELD

Embodiments of the present invention relate to an optical sensing type built in touch control screen panel and a display device.

BACKGROUND

As display technologies have been developed rapidly, touch control screen panels have gradually spread over daily life. Now, based on working principle, the touch control screen panels generally include a resistance sensing type touch control screen panel, a capacitance sensing type touch control screen panel, an optical sensing type touch control screen panel, and so on. Based on structures, the touch control screen panels generally include: a touch control screen panel being attached outside a display panel (Out-cell touch panel), a touch control screen panel attached on a display panel (On-cell touch panel), and a touch control screen panel built in a display panel (In-cell touch panel). The structure of the touch control screen panel built in a display panel not only can reduce total thickness of the touch control screen panel, but also reduce fabrication cost of the touch control screen panel significantly, and is favored by many large panel manufactures.

Now, the design of the touch control screen panel built in the display panel is implemented mainly in a resistance sensing type, a capacitance sensing type, or an optical sensing type. The resistance sensing type belongs to a low-end sensing technique with short service life of the product. The capacitance sensing type has been developed rapidly and is very popular; however, the capacitance sensing type touch control screen panel is mainly adapted to a display device with medium or small size, for example, for products with sizes of 10 inch or less. But for the display devices with large size, the capacitance sensing type touch control screen panel may result in problems such as signal interference and signal delay. As a next generation touch sensing technique, the optical sensing type touch control screen panel may not be limited in sizes, have long service life and stable performance in its products, and can resolve the problems of signal interference and signal delay.

SUMMARY

According to an embodiment of the present invention, an optical sensing type built in touch control screen panel comprising an array substrate having a plurality of pixel units arranged in a matrix is provided.

The array substrate has a touch control scanning line located between adjacent rows of the pixel units.

The array substrate has a touch control reading line located between adjacent columns of the pixel units.

The array substrate has a photosensitive transistor and a touch control switch unit located in a region defined by the touch control scanning lines and the touch control reading lines. The photosensitive transistor has a drain connected with the touch control switch unit. The touch control switch unit is connected with the touch control scanning line and the touch control reading line, respectively, so as to control ON/OFF state between the drain of the photosensitive transistor and the touch control reading line.

According to an embodiment of the present invention, a display device comprising the optical sensing type built in touch control screen panel according to the embodiment of the present invention is provided.

In the optical sensing type built in touch control screen panel and the display device provided according to the embodiments of the present invention, the touch control scanning line is disposed between the adjacent rows of the pixel units on the array substrate, the touch control reading line is disposed between adjacent columns of the pixel units on the array substrate, and a photosensitive transistor and a touch control switch unit are disposed in the region defined by the touch control scanning lines and touch control reading lines on the array substrate; the drain of the photosensitive transistor is connected with the touch control switch unit, the touch control switch unit is connected with the touch control scanning line and the touch control reading line, respectively. When the touch control scanning line controls the touch control switch unit in ON state, the touch control signals generated by irradiating the photosensitive transistor with a laser pointer is outputted to the touch control reading line via the touch control switch unit in ON state, thus achieving the functions of optical sensing touch control, which can avoid the problems of signal interference and signal delay occurred in big screen panels implemented in a form of the capacitance sensing type.

BRIEF DESCRIPTION OF THE DRAWINGS

In order to clearly illustrate the technical solutions of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can implement other embodiment(s), without any creative work, which should fall within the scope of the invention.

Figure 1:
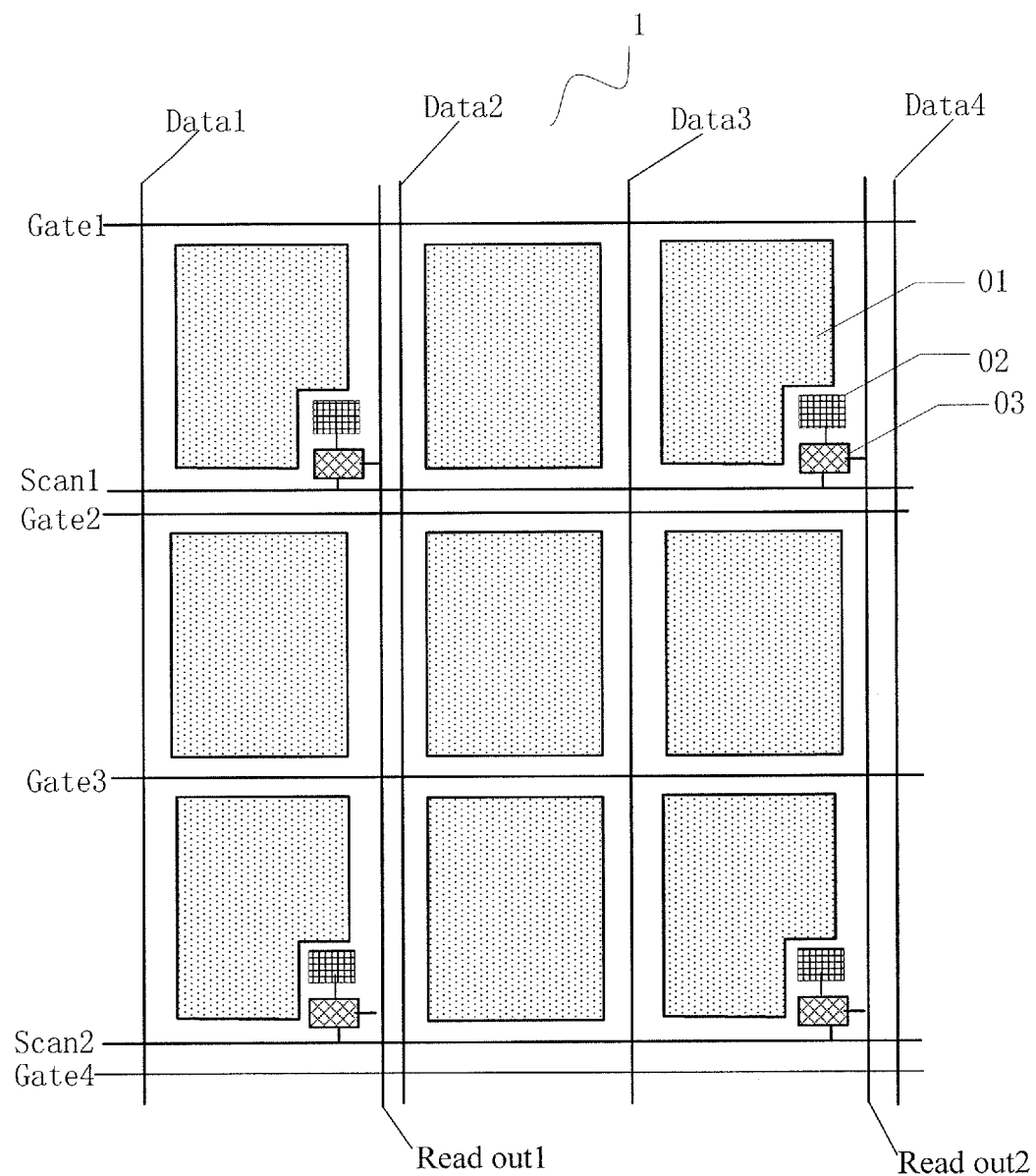
FIG. 1 is a first schematic view of an array substrate in an optical sensing type built in touch control screen panel according to an embodiment of the present invention.

As shown in FIG. 1, an optical sensing type built in touch control screen panel according to an embodiment of the present invention includes an array substrate 1 having a plurality of pixel units 01 arranged in a matrix.

The array substrate 1 has touch control scanning lines Scan N (N=1, 2, 3 . . . , . . . ) provided between adjacent pixel units 01.

The array substrate 1 has touch control reading lines Read out N (N=1, 2, 3 . . . , . . . ) provided between adjacent pixel units 01.

The array substrate 1 has a photosensitive transistor 02 and a touch control switch unit 03 (the detail structure of the photosensitive transistors 02 and the touch control switch units 03 are not shown in FIG. 1) provided in a region defined by the touch control scanning lines Scan 1 and Scan 2 and the touch control reading lines Read out 1 and Read out 2. The drain of the photosensitive transistor 02 is connected with the touch control switch unit 03, and the touch control switch unit 03 is connected with the touch control scanning lines Scan N and the touch control reading lines Read out N, respectively.

When the touch control scanning lines Scan N control the touch control switch unit 03 in On state, touch control signals generated by irradiating the photosensitive transistor 02 by a laser pointer are transmitted to the touch control reading lines Read out N via the touch control switch unit 03 in ON state. That is, the touch control switch unit is connected between the drain of the photosensitive transistor and the touch control reading line, which can control ON/OFF state between the drain of the photosensitive transistor and the touch control reading line.

Figure 2:
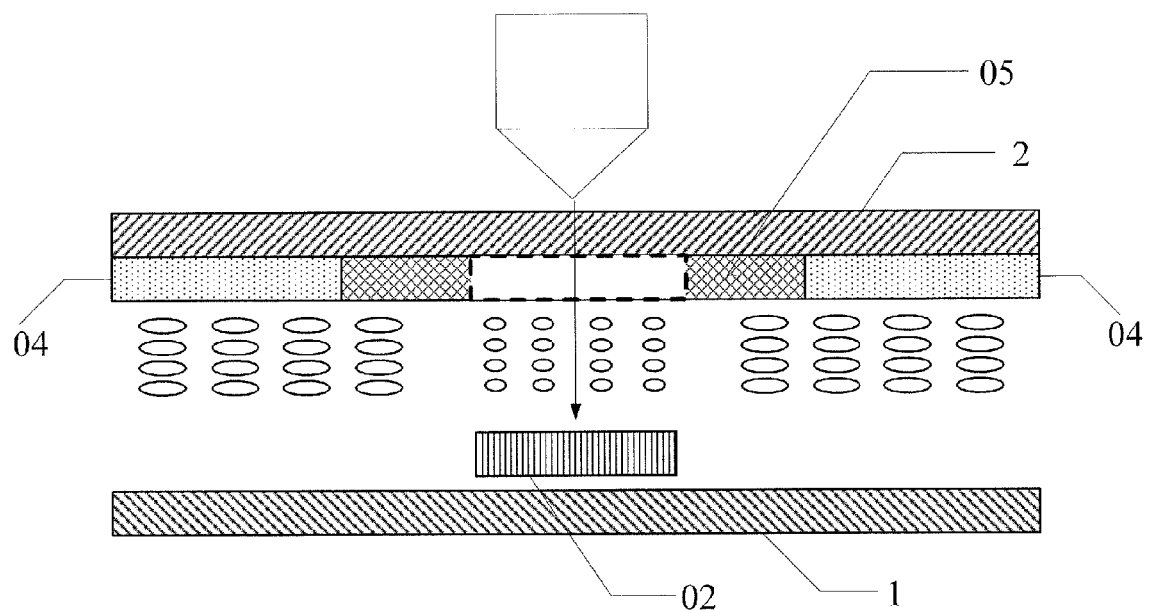
FIG. 2 is a sectional view of an optical sensing type built in touch control screen panel according to an embodiment of the present invention.

In an implementation, as shown in FIG. 2, the touch control screen panel according to the embodiment of the present invention may be applied to a structure in which color filters 04 are disposed in a counter substrate 2 opposing the array substrate 1, i.e. a color filter substrate. The color filters 04 are separated from each other by a black matrix 05. Certainly, it may also be applied to a structure in which the color filters are disposed in the array substrate, and there is no limitation herein. The touch control screen panel according to the embodiment of the present invention mentioned above is described in an example where the counter substrate 2 is a color filter substrate as following. As shown in FIG. 2, in an implementation, it is necessary to dispose an opening in the region of the black matrix 05 corresponding to the photosensitive transistor 02. The opening is shown in dash line in FIG. 2. In this way, incoming lights that is laser lights emitted from a laser pointer can irradiate on the photosensitive transistor 02 through the opening area, achieving a touch control function.

For example, as shown in FIG. 1, in a case where the touch control reading lines Read out N are disposed in the array substrate 1 between adjacent pixel units 01, the touch control reading lines Read out N and data signal lines Data N in the array substrate may be disposed in the same layer and insulated from each other, that is, the data signal lines Data N and the touch control reading lines Read out N insulated from the data signal lines Data N are fabricated at the time. In this way, when the array substrate is fabricated, it is not necessary to add any additional processing steps. The pattern of the data signal lines Data N and the touch control reading lines Read out N can be formed in a single processing step, thus reducing fabricating cost and increasing product added value. However, the touch control reading lines Read out N and the data signal lines Data N can also be fabricated separately, and there is no limitation herein.

Similarly, as shown in FIG. 1, in a case where the touch control scanning lines Scan N are disposed between adjacent pixel units 01 provided in the array substrate, the touch control scanning lines Scan N and gate signal lines Gate N in the array substrate may be disposed in the same layer in a similar manner described as above and insulated from each other. The details is not repeated herein.

Figure 3:
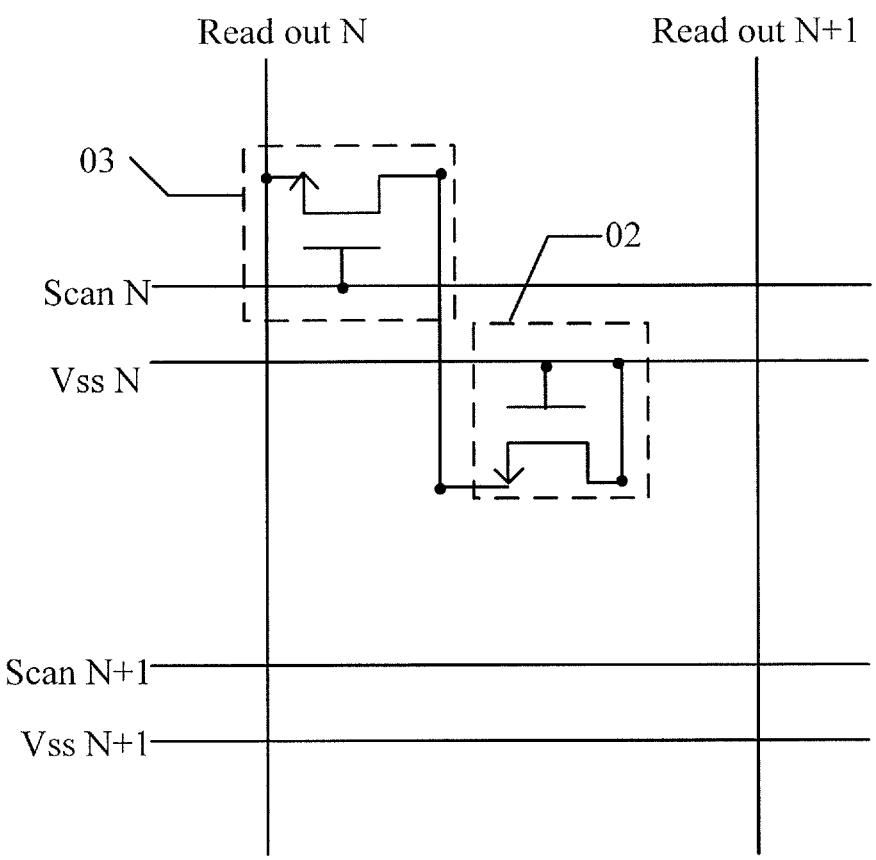
FIG. 3 is a second schematic view of an array substrate in an optical sensing type built in touch control screen panel according to an embodiment of the present invention.

Preferably, in the touch control screen panel according to the embodiment of the present invention, as shown in FIG. 3, a touch control switch unit 03 connecting a photosensitive transistor 02 and a touch control reading lines Read out N, for example, may be a thin film transistor (TFT) device. The TFT device has a gate connected with the touch control scanning lines Scan N, a drain connected with the touch control reading lines Read out N, and a source connected with the photosensitive transistor 02. When scanning signals, i.e. high level signals are loaded on the touch control scanning lines Scan N, the TFT device acting as the touch control switch unit 03 is in ON state. If there is a laser pointer irradiating the photosensitive transistor 02 at the moment, the carrier concentration in an active layer of the photosensitive transistor 02 can be increased significantly, and the photosensitive transistor 02 can transmit touch control signals to corresponding touch control reading lines Read out N via the TFT device in ON state.

In an implementation, the respective TFT devices acting as the touch control switch units 03 can be formed in the same layer as the respective existing TFT devices for controlling switching of the pixel units in the array substrate. Thus it can be implemented by only changing the pattern of the respective film layer without adding any new processing steps, thereby reducing fabricating cost and increasing production efficiency. Certainly, in an implementation, the touch control switch unit 03 may also be other structures. The details are not repeated herein.

Preferably, in an implementation of the touch control screen panel according to the embodiment of the present invention, at least one of the gate signal lines in the array substrate can serve as the touch control scanning line, thus avoiding adding new wiring in the array substrate. In this way a large aperture ratio may be assured in the touch control screen panel. And the gate signal lines are used as the touch control scanning lines, thus avoiding addition of a separate drive chip IC for controlling the touch control scanning lines, which can reduce fabricating cost.

An example in which at least one of the gate signal line Gate N acts as the touch control scanning line Scan N in the array substrate is described as following.

Generally, each pixel unit in an array substrate of a touch control screen panel comprises a plurality of sub-pixel units which generally include blue color sub-pixel units. Thus, in an implementation of the touch control screen panel according to the embodiment of the present invention, a photosensitive transistor may be disposed at the blue color sub-pixel unit defined by the touch control scanning line and the touch control reading line. Due to higher light transmittance in the blue color sub-pixel unit, the sensitivity of the touch control can be increased by disposing the photosensitive transistor in the region of the blue color sub-pixel unit, and thus. Certainly, the photosensitive transistor may be disposed in a region of other sub-pixel unit as needed, and there is no limitation herein.

In particular, in the touch control screen panel according to the embodiment of the present invention mentioned above, in order to avoid errors due to touch control signals generated by accidental lights other than those irradiated on the photosensitive transistor by the laser pointer, as shown in FIG. 3, the gate and source of the photosensitive transistor 02 may be connected with a constant voltage signal line Vss N, which applies a reverse bias voltage to the photosensitive transistor 02, so that the photosensitive transistor 02 would not output a signal without laser irradiation, and the constant voltage signal line Vss N is disposed at a gap between adjacent pixel units. In an implementation, a constant voltage such as −8 V may be applied to the constant voltage signal line Vss N. In this way, the photosensitive transistor 02 is operated as following: when the laser pointer does not irradiate the photosensitive transistor 02, the photosensitive transistor 02 is in a reverse bias state due to the reverse voltage applied by the constant voltage signal line Vss N, i.e. there is no touch control signal outputted from the photosensitive transistor 02; when the laser pointer irradiates the photosensitive transistor 02, the light intensity received by the photosensitive transistor 02 increases, thus the carrier concentration in the active layer of the photosensitive transistor 02 increases. The touch control signals may be transmitted to the touch control switch unit 03 from the photosensitive transistor 02, and when the touch control switch unit 03 is in ON state, the touch control signal is outputted to the touch control reading lines Read out N via the touch control switch unit 03. Further, the touch control signal outputted by the photosensitive transistor 02 depends on the light intensity irradiated by the laser pointer. The stronger light intensity the laser pointer irradiates, the stronger touch control signal is outputted to the touch switch 03 from the photosensitive transistor 02.

For example, the photosensitive transistor is configured to output photo sensing signals generated by lights from the drain thereof only if the photosensitive transistor applied with the reverse bias voltage receives lights with an intensity greater than a predetermined light intensity. In practice, the light intensity of the laser from the laser pointer is generally far more greater than that of the ambient light, and thus the photosensitive transistor 02 mentioned above may effectively avoid the error.

In particular, the constant voltage signal line may be disposed at a gap between adjacent pixel units, preferably, the constant voltage signal line and the data signal lines in the array substrate may be disposed in the same layer and insulated from each other. The constant voltage signal line can also be disposed at a gap between adjacent rows of the pixel units. Preferably, each of the constant voltage signal lines and the gate signal lines in the array substrate may be disposed in the same layer and insulated from each other. The details are not repeated herein.

The touch control screen panel according to the embodiments of the present invention mentioned above may be applied to a twisted nematic (TN) type liquid crystal panel, an in-plane switch (IPS) liquid crystal panel, and an advanced super dimension switch (ADS) liquid crystal panel. The details are not repeated herein.

Figure 4A:
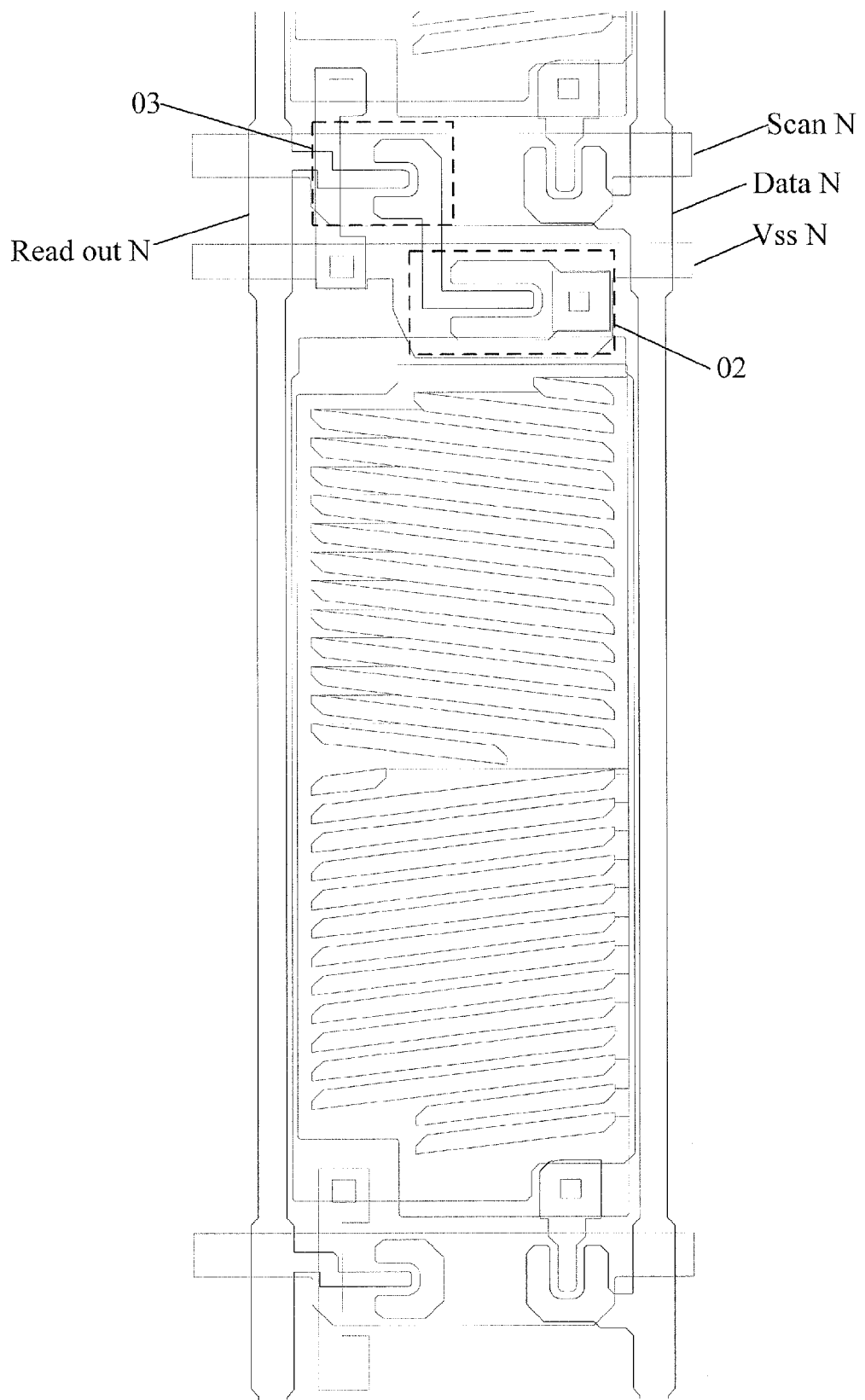
FIG. 4a is a first schematic view of the detail structure of a sub-pixel unit in a case where the optical sensing type built in touch control screen panel according to the embodiment of the present invention is applied in ADS mode.
Figure 4B:
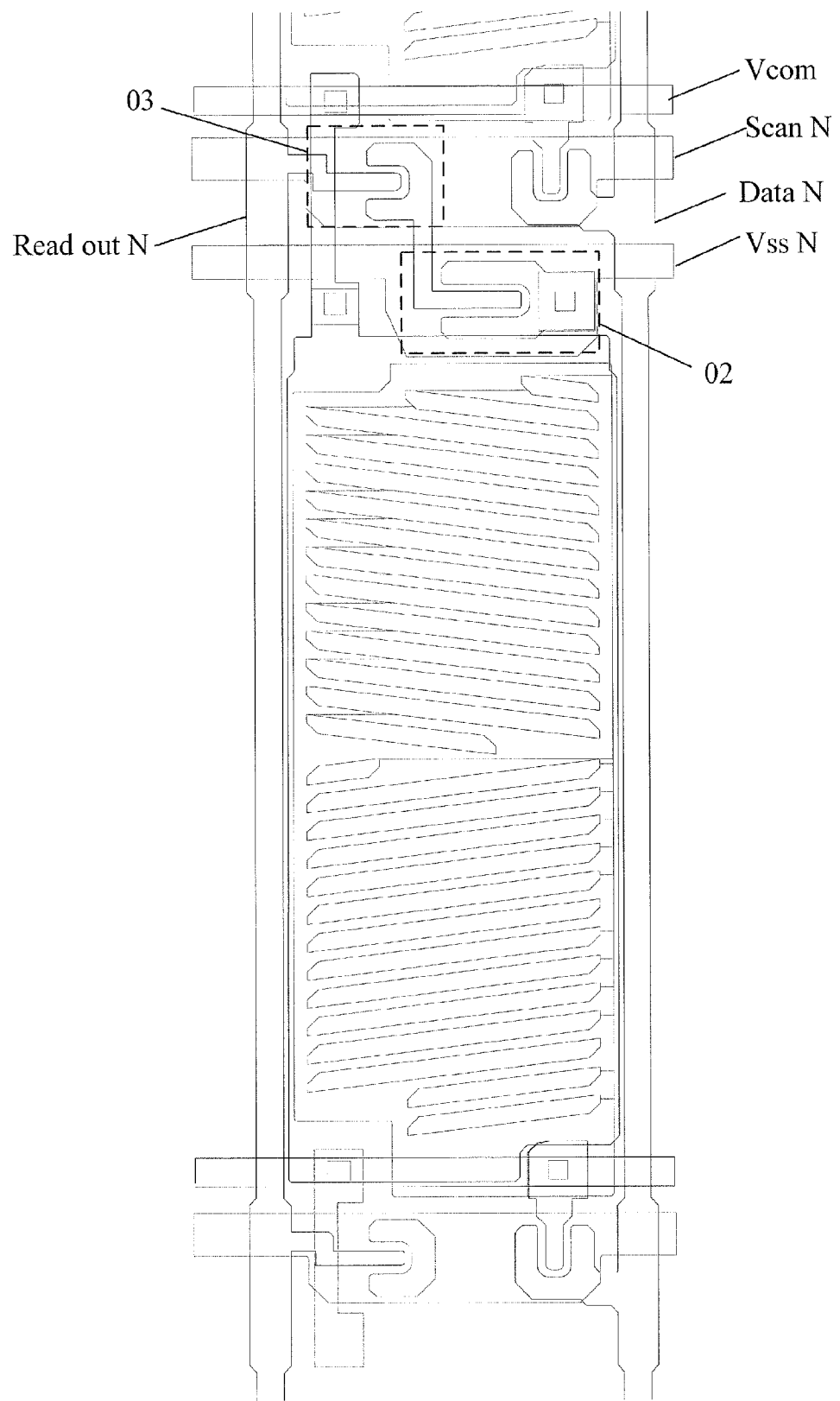
FIG. 4b is a second schematic view of the detail structure of a sub-pixel unit when the optical sensing type built in touch control screen panel according to the embodiment of the present invention is applied in ADS mode.

In particular, when the touch control screen panel according to the embodiments of the present invention is applied to the ADS type liquid crystal panel, in order to ensure the touch control screen panel with a large aperture ratio. As shown in FIG. 4a, at least one of common electrode signal lines Vcom in the array substrate may be the constant voltage signal line Vss N, which can further increase the aperture ratio, compared with the constant voltage signal line Vss N separately arranged in the array substrate as shown in FIG. 4b. It is noted that in an implementation, the common electrode signal line Vcom connected respectively with the gate and source of the photosensitive transistor 02 can refer to a transparent common electrode opposing the pixel electrode, and can also refer to a common electrode signal line made of metal materials. The details are not repeated herein.

Figure 5:
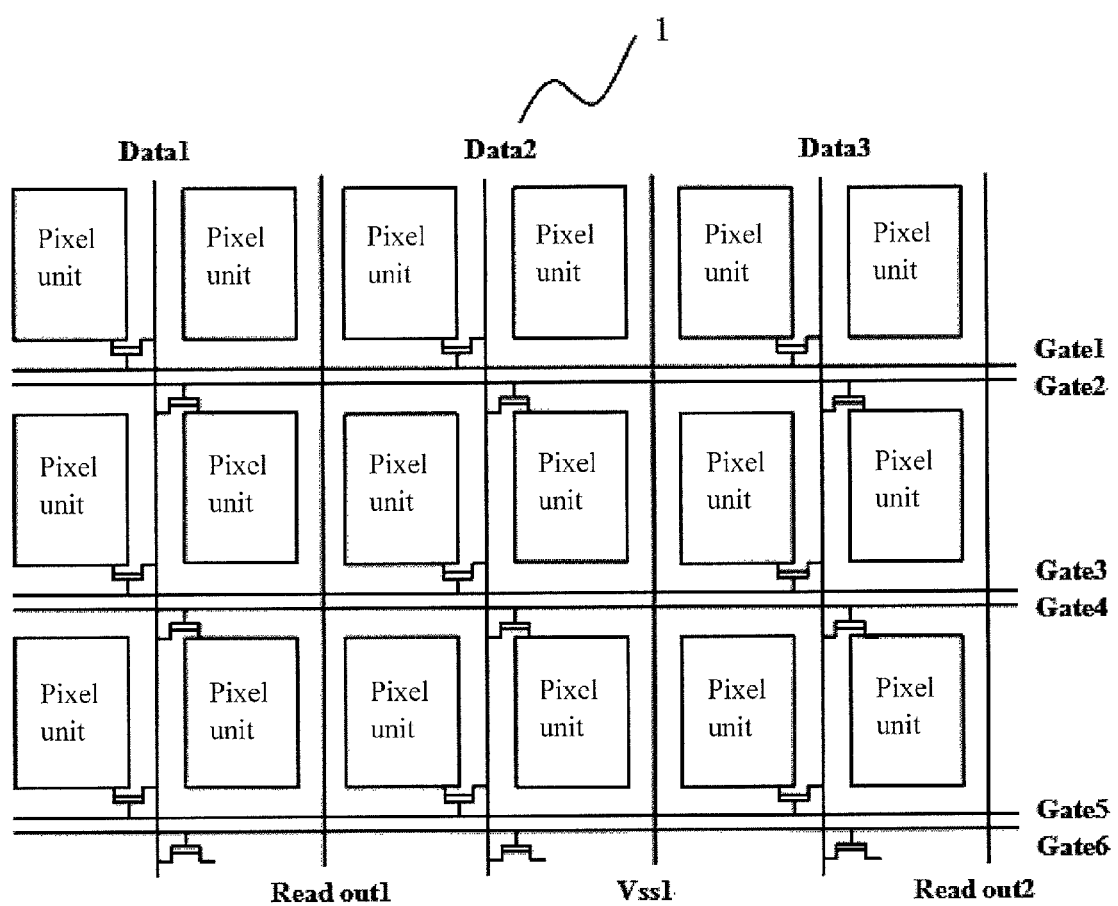
FIG. 5 is a third schematic view of an array substrate in the optical sensing type built in touch control screen panel according to the embodiment of the present invention.

Preferably, in order to enlarge the aperture ratio of the touch control screen panel with large size, in an implementation, the pixel units in the array substrate of the touch control screen panel according the embodiments of the present invention can have a double gate structure, as shown in FIG. 5, in which Data N (N=1, 2, 3 . . . , . . . ) refers to data signal line of the array substrate, Gate N (N=1, 2, 3 . . . , . . . ) refers to gate signal line of the array substrate. The photosensitive transistor 02 and the touch control switch unit 03 are not shown in FIG. 5. In the double gate structure, there are two gate signal lines between adjacent rows of the pixel units on the array substrate, such as Gate1 and Gate2, Gate3 and Gate4, Gate5 and Gate6. Two adjacent columns of the pixel units constitute a set of pixel units, and share one of the data signal lines Date1, Date2, and Date3 disposed between two columns of the pixel units. The double gate structure may reduce quantities of the data signal lines and the source drive IC by doubling the number of the gate signal lines, thus reducing total cost of the display.

Further, the double gate structure as shown in FIG. 5 may free up spaces between adjacent columns of the pixel units for the data signal lines by changing positions of the gate signal lines in adjacent two rows of the pixel units and the TFT switch. In this way, as shown in FIG. 5, each of the touch control reading lines Read out N may be disposed at a gap between adjacent columns of the pixel units, that is, each of the touch control reading lines Read out N is located at a gap between adjacent columns of the pixel units in an implementation, thus further reducing area ratio taken up by the pixel units, ensuring that the touch control screen panel has a large aperture ratio.

Further, when the array substrate 1 has constant voltage signal lines Vss N applying a reverse bias on the photosensitive transistor 02. In an implementation, each of the constant voltage signal lines Vss N may be disposed at a gap between adjacent columns of the pixel units where the touch control reading lines Read out N are not disposed, so as to further ensure the aperture ratio of the touch control screen panel.

The embodiments mentioned above have been described in the example of the touch control screen panel applied to a liquid crystal panel; however, the built in touch control screen panels according to the embodiments of the present invention are not limited to the liquid crystal panel. For example, the touch control screen panel structure may be applied to organic light emitting displays. In the built in touch control screen panel based on the organic light emitting display structure, the structure mentioned above for performing touch control function may also be formed in the array substrate.

Based on the same inventive concept, a display device according to an embodiment of the present invention comprising the optical sensing type built in touch control screen panel according to the embodiments of the present invention mentioned above is provided. The display device can be any kinds of products or components with a display function, such as a cellphone, a tablet, a TV set, a display, a notebook computer, a digital frame, a navigator, and so on. Embodiments of the display device may be referred to the embodiments of the optical sensing type built in touch control screen panel mentioned above. The details are not repeated herein.

An optical sensing type built in touch control screen panel and a display device are provided according to embodiments of the present invention. A touch control scanning line is disposed between adjacent rows of the pixel units on a array substrate, a touch control reading line is disposed between adjacent columns of the pixel units on the array substrate, and a photosensitive transistor and a touch control switch unit are disposed on the array substrate in the region defined by the touch control scanning lines and touch control reading lines; the drain of the photosensitive transistor is connected with the touch control switch unit, the touch control switch unit is connected with the touch control scanning line and the touch control reading line, respectively; when the touch control scanning line controls the touch control switch unit in ON state, touch control signals generated by irradiating the photosensitive transistor with a laser pointer are outputted to the touch control reading lines via the touch control switch units in ON state, thus achieving photo sensing touch control functions, and the problems of signal interference and signal delay occurred in big screen panels implemented in a form of the capacitance sensing type.

The above description is only the exemplary embodiments of the present invention and not intended to limited the protection scope of the present invention, which is defined by appending claims.

The invention claimed is:

1. An optical sensing type built in touch control screen panel, comprising an array substrate having a plurality of pixel units arranged in a matrix, wherein:
the array substrate has touch control scanning lines between adjacent rows of the pixel units;
the array substrate has touch control reading lines between adjacent columns of the pixel units;
the array substrate has a photosensitive transistor and a touch control switch unit in a region defined by the touch control scanning lines and the touch control reading lines; the photosensitive transistor has a drain connected with the touch control switch unit, the touch control switch unit is connected with the touch control scanning line and the touch control reading line, respectively, so as to control ON/OFF between the drain of the photosensitive transistor and the touch control reading line, and the array substrate has a constant voltage signal line applying a reverse bias voltage to the photosensitive transistor; the photosensitive transistor has a gate and a source connected respectively with the constant voltage signal line, so that the photosensitive transistor does not output a signal without laser irradiation.

2. The optical sensing type built in touch control screen panel according to claim 1, wherein the touch control switch unit is a thin film transistor (TFT) device; the TFT device has a gate connected with the touch control scanning line, a drain connected with the touch control reading line, and a source connected with the drain of the photosensitive transistor.

3. The optical sensing type built in touch control screen panel according to claim 1, further comprising a counter substrate opposing the array substrate, a black matrix arranged around each pixel unit is disposed on the array substrate, and there is an opening in the black matrix to correspond to the photosensitive transistor.

4. The optical sensing type built in touch control screen panel according to claim 3, wherein the counter substrate is a color filter substrate.

5. The optical sensing type built in touch control screen panel according to claim 1, wherein at least one of gate signal lines in the array substrate is the touch control scanning line.

6. The optical sensing type built in touch control screen panel according to claim 1, wherein each of the pixel units comprises a plurality of sub-pixel units comprising a blue color sub-pixel unit; the photosensitive transistor is disposed only at a blue color sub-pixel unit in a region defined by the touch control scanning lines and the touch control reading lines.

7. The optical sensing type built in touch control screen panel according to claim 1, wherein the constant voltage signal line is located at a gap between adjacent pixel units.

8. The optical sensing type built in touch control screen panel according to claim 7, wherein at least one of common electrode signal lines in the array substrate is the constant voltage signal line.

9. The optical sensing type built in touch control screen panel according to claim 7, wherein the photosensitive transistor is configured to output photo sensing signals generated by lights from the drain thereof if the photosensitive transistor applied with the reverse bias voltage receives the lights with intensity greater than a predetermined light intensity.

10. The optical sensing type built in touch control screen panel according to claim 1, wherein there are two gate signal lines in the array substrate between two adjacent rows of pixel units, and two adjacent columns of the pixel units constitute a set of pixel unit columns, each set of the pixel unit columns shares a data signal line located between the two columns of pixel units.

11. The optical sensing type built in touch control screen panel according to claim 10, wherein each of the touch control reading lines is located at a gap between adjacent columns of the pixel units.

12. The optical sensing type built in touch control screen panel according to claim 11, wherein each of the constant voltage signal lines is located at a gap between adjacent columns of pixel units where the touch control reading lines is not disposed.

13. The optical sensing type built in touch control screen panel according to claim 12, wherein the photosensitive transistor is configured to output photo sensing signals generated by lights from the drain thereof if the photosensitive transistor applied with the reverse bias voltage receives the lights with intensity greater than a predetermined light intensity.

14. The optical sensing type built in touch control screen panel according claim 1, wherein in a case where the touch control scanning lines control the touch control switch units in ON state, touch control signals generated by irradiating the photosensitive transistor with a laser pointer are outputted to the touch control reading lines via the touch control switch units in ON state.

15. A display device, comprising an optical sensing type built in touch control screen panel comprising an array substrate having a plurality of pixel units arranged in a matrix, wherein:
the array substrate has touch control scanning lines between adjacent rows of the pixel units;
the array substrate has touch control reading lines between adjacent columns of the pixel units;
the array substrate has a photosensitive transistor and a touch control switch unit in a region defined by the touch control scanning lines and the touch control reading lines; the photosensitive transistor has a drain connected with the touch control switch unit, the touch control switch unit is connected with the touch control scanning line and the touch control reading line, respectively, so as to control ON/OFF between the drain of the photosensitive transistor and the touch control reading line, and the array substrate has a constant voltage signal line applying a reverse bias voltage to the photosensitive transistor; the photosensitive transistor has a gate and a source connected respectively with the constant voltage signal line, so that the photosensitive transistor does not output a signal without laser irradiation.

16. The display device according to claim 15, wherein the optical sensing type built in touch control screen panel further comprises a counter substrate opposing the array substrate, a black matrix arranged around each pixel unit is disposed on the array substrate, and there is an opening in the black matrix to correspond to the photosensitive transistor.

17. The display device according to claim 15, wherein each of the pixel units comprises a plurality of sub-pixel units comprising a blue color sub-pixel unit; the photosensitive transistor is disposed at a blue color sub-pixel unit in a region defined by the touch control scanning lines and the touch control reading lines.

18. The display device according to claim 15, wherein the constant voltage signal line is located at a gap between adjacent pixel units.

19. The display device according to claim 18, wherein the photosensitive transistor is configured to output photo sensing signals generated by lights from the drain thereof if the photosensitive transistor applied with the reverse bias voltage receives the lights with intensity greater than a predetermined light intensity.

20. The display device according to claim 15, wherein in a case where the touch control scanning lines control the touch control switch units in ON state, touch control signals generated by irradiating the photosensitive transistor with a laser pointer are outputted to the touch control reading lines via the touch control switch units in ON state.

* * * * *